(12) United States Patent
Li et al.

(10) Patent No.: US 9,911,617 B2
(45) Date of Patent: Mar. 6, 2018

(54) ETCHING METHOD

(71) Applicant: Institute of Microelectronics, Chinese Academy of Sciences, Beijing (CN)

(72) Inventors: Junjie Li, Beijing (CN); Junfeng Li, Beijing (CN); Qinghua Yang, Beijing (CN); Jinbiao Liu, Beijing (CN); Xiaobin He, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/299,169

(22) Filed: Oct. 20, 2016

(65) Prior Publication Data
US 2017/0186619 A1    Jun. 29, 2017

(30) Foreign Application Priority Data
Dec. 25, 2015   (CN) .......................... 2015 1 0996470

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/3065* | (2006.01) |
| *H01L 21/308* | (2006.01) |
| *H01L 21/3213* | (2006.01) |

(52) U.S. Cl.
CPC ...... *H01L 21/3065* (2013.01); *H01L 21/3085* (2013.01); *H01L 21/32136* (2013.01); *H01L 21/32139* (2013.01)

(58) Field of Classification Search
USPC .......................................................... 216/57
See application file for complete search history.

(56) References Cited

U.S. PATENT DOCUMENTS

2005/0266593 A1\* 12/2005 Suzawa ..................... C23F 4/00
                                                         438/30

\* cited by examiner

*Primary Examiner* — Roberts Culbert
(74) *Attorney, Agent, or Firm* — Pillsbury Winthrop Shaw Pittman LLP

(57) ABSTRACT

The invention discloses a novel dry etching method, which comprises the following steps: forming a to-be-etched layer on a semiconductor substrate; forming a masking material on the to-be-etched layer; carrying out dry etching on the masking material and the to-be-etched layer; simultaneously carrying out lateral etching (parallel to the surface of the substrate) of a masking layer and longitudinal etching (vertical to the surface of the substrate) of the to-be-etched layer; and obtaining the inclination angle (the included angle between a slope surface and the surface of the substrate) of the corresponding etched slope surface by accurately controlling the speed ratio. The method can flexibly adjust the inclination angle of the etched slope surface within a large range (0-90 degrees), and especially has advantages in the field of the application with a small inclination angle (smaller than 20 degrees) of the etched slope surface in comparison with a conventional etching method.

15 Claims, 3 Drawing Sheets

ETCHING METHOD

CROSS-REFERENCE TO RELATED APPLICATION(S)

This application claims priority to Chinese Patent Application No. 201510996470.2, filed on Dec. 25, 2015, entitled "ETCHING METHOD," which is incorporated herein by reference in its entirety.

TECHNICAL BACKGROUND

The present invention relates to the field of novel device manufacture of semiconductor integrated circuit, in particular, relates to an etching method.

BACKGROUND ART

As is well known, thin film growth is a traditional process in semiconductor manufacture, a gentle slope is beneficial to the improvement of step coverage rate on undulating surface, which is a challenge in thin film growth. Specifically, compared with Chemical Vapor Deposition (CVD), Physical Vapor Deposition (PVD) has a worse ability of step coverage, however, PVD has its own advantages, for example, physical sputtering is employed in a PVD process so that a thin film grown by a PVD process may have a purity which is consistent with the sputtering target, while a CVD process may introduce reactants from incomplete reaction or non-target by-products in a thin film growth because the CVD process always involves chemical reaction.

In some areas where high material purity and device performance are required, a PVD process is always employed in thin film deposition, therefore, it is extremely essential to manufacture steps into a slow slope for purpose of increasing coverage rate of thin film.

A metal layer 200 is deposited on a semiconductor substrate 100 and a dielectric layer 300 which is formed by a PVD process is deposited on the metal layer 200, with reference to FIG. 1A. The dielectric layer 300 has a relatively smaller thickness on the sidewall of the metal layer 200 because of low step coverage rate resulted by the PVD process. Specially, the edge of the step may be completely exposed if the metal layer 200 has a relatively large thickness, in this case device performance may be influenced.

As FIG. 1B shows, if the step is manufactured into a slow slope, the thin film on the slope can cover the slope well and device performance may be highly improved.

Therefore, it becomes essentially necessary to introduce the manufacture of slope edges in semiconductor manufacture.

There are two major categories of etching methods adopted in semiconductor manufacture currently. One is wet etching, and a curved surface may be obtained by an isotropic etching method with reference to FIG. 2. As showed in FIG. 3, the other one is an anisotropic dry etching (plasma etching), and an etching profile with a steep shape may be obtained. See FIG. 4, a tile etching angle may be obtained by over passivation on sidewalls in a dry etching atmosphere, but the angle is generally larger than 45 degrees which could not satisfy the requirement of the semiconductor manufacture in some specific application areas.

At present, a better etching method is urgently needed to make it possible that the inclination angle of etching slopes can be regulated within a large range, such that device performance may be improved and device reliability may be enhanced.

SUMMARY

In order to solve the above problems, the present disclosure provides an etching method which comprises: forming a layer to be etched on a semiconductor substrate layer; forming a mask material on the layer to be etched; dry etching the mask material and the layer to be etched. In the dry etching process, a lateral etching process (parallel to the surface of the semiconductor substrate) is performed on the mask material, at the same time, a longitudinal etching process (vertical to the surface of the semiconductor substrate) is performed on the layer to be etched, such that an inclination angle of the slope edge which is formed by the layer to be etched could be obtained by accurate control of the ratio of the lateral etching speed to the longitudinal etching speed.

Specifically, the angle value (θ) could be regulated by adjusting the ratio of the lateral etching rate (ERB) to the mask material to the longitudinal etching rate (ERA) to the layer to be etched according to c tan θ=ERB/ERA.

For example, in case that the ratio value is 1:1, an angle of 45 degrees could be obtained; in case that the desired angle is 12 degrees, because c tan 12°~5, the ratio is 5:1. If a smaller angle is expected, the ratio could be larger than 5:1.

According to an aspect of the present disclosure, the mask material is a photoresist layer having a thickness of 100 nm-100 μm, the layer to be etched may be a semiconductor layer or a metal layer, for example, molybdenum (Mo) or tungsten (W).

According to an aspect of the present disclosure, the inclination angle of a metal electrode edge may be etched to be smaller than 20 degrees to make the edge get a good cover in a later PVD process. The etching gas may comprise: $SF_6/CF_4/O_2$, which are introduced into an etching chamber at the same time. The $SF_6$ gas and the $CF_4$ gas are used to etch the metal layer, while the $O_2$ gas is used to etch the mask photoresist layer thereof.

If the metal layer is made of Mo, the ratio of the lateral etching speed to the photoresist layer to the longitudinal etching speed to Mo is preferably 7:1. Preferably, the etching parameters are listed as follows: an air pressure of 50-80 mT, an RF Bias of 100-800 W and an Up and down electrode RF power of 20-500 W. The dry etching may be performed with the $SF_6$ gas having a flow rate of 10-200 sccm, the $CF_4$ gas having a flow rate of 5-100 sccm and the $O_2$ gas having a flow rate of 20-500 sccm.

If the metal layer is made of W, the ratio of the lateral etching speed to the photoresist layer to the longitudinal etching speed to W is preferably 10:1. Preferably, the etching parameters are listed as follows: an air pressure of 3-60 mT, an RF Bias of 100-500 W and an Up and down electrode RF power of 30-200 W. The dry etching may be performed with the $SF_6$ gas having a flow rate of 20-100 sccm, the $CF_4$ gas having a flow rate of 5-100 sccm and the $O_2$ gas having a flow rate of 20-200 sccm.

The present disclosure provides a method, in which, the etching slope angle can be flexibly adjusted by regulating the ratio of the lateral etching speed to the mask material to the different longitudinal etching speed to the layer to be etched, therefore, a slope angle smaller than 20 degrees can be achieved. Using the present disclosure, a follow-up process window can be improved, semiconductor device performance and reliability can be highly enhanced as well.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1A:
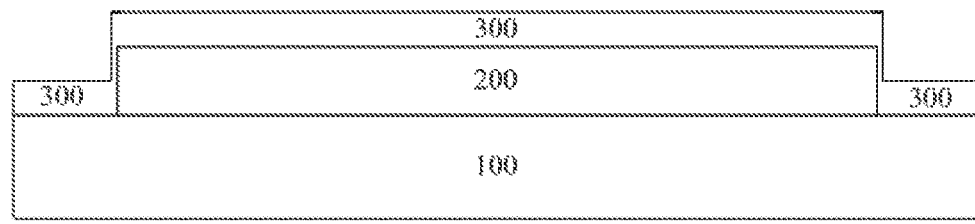
FIG. 1A is schematic views illustrating etching technology of the prior art, in which, a metal layer is deposited on a semiconductor substrate and a dielectric layer is deposited on the metal layer.
Figure 1B:
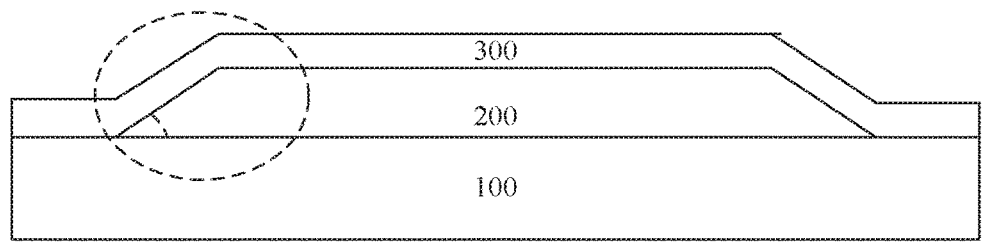
FIG. 1B is a schematic view illustrating etching technology of the prior art, in which, if the step is manufactured into a slow slope, the thin film on the slope can cover the slope.
Figure 2:
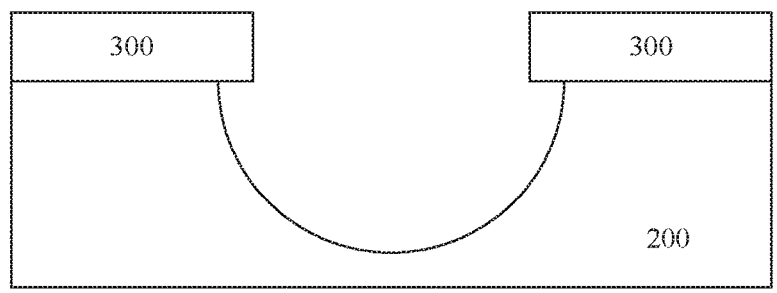
FIG. 2 is a schematic view illustrating etching technology of the prior art, in which, a curved surface may be obtained by an isotropic etching method.
Figure 3:
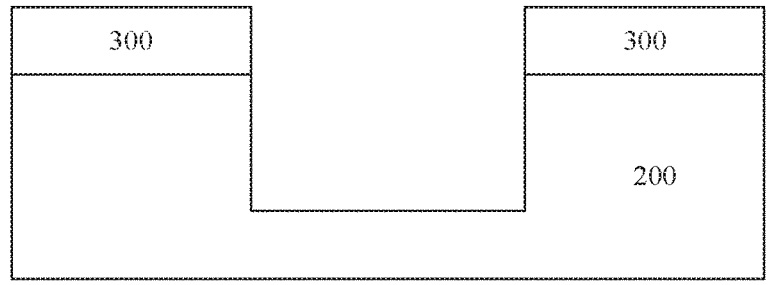
FIG. 3 is a schematic view illustrating etching technology of the prior art, in which, an anisotropic dry etching (plasma etching), and an etching profile with a steep shape may be obtained.
Figure 4:
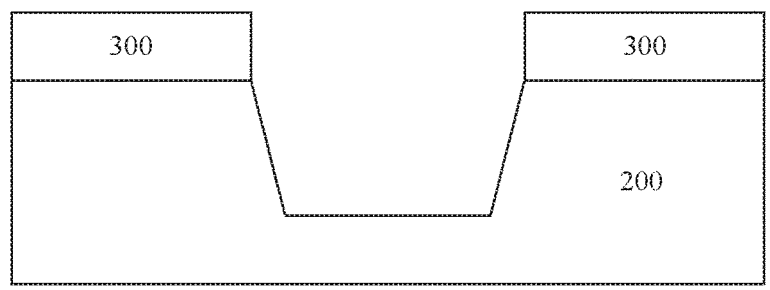
FIG. 4 is a schematic view illustrating etching technology of the prior art, in which, a tile etching angle may be obtained by over passivation on sidewalls.

Hereinafter, descriptions are given for embodiments of the present disclosure with reference to the attached drawings. Furthermore, description to well known structure and technology is omitted to avoid unnecessary confusion of the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

It could be understood that, while describing device structures, when a layer/element is recited as being "on" a further layer/element, the layer/element can be disposed directly on the further layer/element, or otherwise there may be an intervening layer/element interposed there between. Further, if a layer/element is "on" a further layer/element in an orientation, then the layer/element can be "under" the further layer/element when the orientation is turned.

According to an embodiment of the present disclosure, an etching method is provided and the method comprises: forming a layer to be etched on a semiconductor substrate layer; forming a mask material on the layer to be etched; dry etching the mask material and the layer to be etched; in the dry etching process, adjusting the ratio of a lateral etching rate (ERB) to the mask material to a longitudinal etching rate (ERA) to the layer to be etched according to c tan θ=ERB/ERA. In the embodiment, θ is the desired angle value of the inclination angle of the end face of the layer to be etched.

Figure 6:
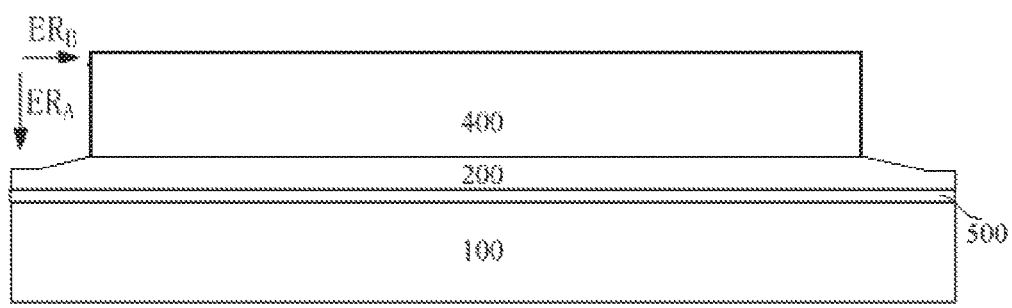
FIG. 6 is a schematic view illustrating some steps of etching a metal layer in accordance with an embodiment of the present disclosure, in which, a dry etching process is performed on the mask material and the metal layer
Figure 7:
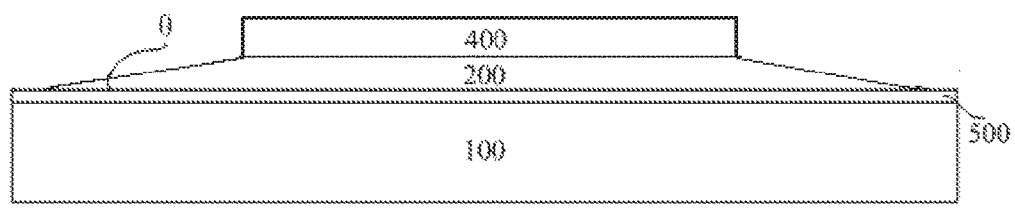
FIG. 7 is a schematic view illustrating some steps of etching a metal layer in accordance with an embodiment of the present disclosure, in which, the dry etching is performed with an optimum etch angle θ can be obtained by adjusting various etching parameters and gas flux parameters.

A preferable embodiment is described in the following details with reference to FIG. 5-FIG. 7.

Figure 5:
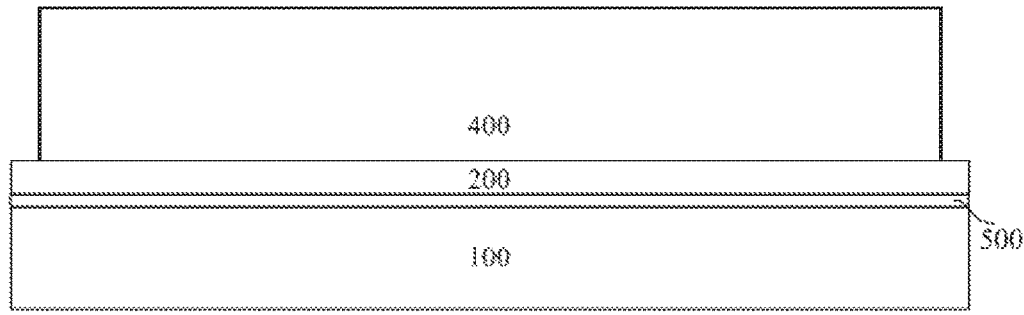
FIG. 5 is a schematic view illustrating some steps of etching a metal layer in accordance with an embodiment of the present disclosure, in which, an oxide cushion layer is formed on a semiconductor layer, a layer to be etched is formed on the oxide cushion layer, and a mask material is formed on the layer to be etched.

See FIG. 5, firstly, an oxide cushion layer 500 is formed on a semiconductor layer 100, a layer to be etched 200 is formed on the oxide cushion layer 500, and a mask material 400 is formed on the layer to be etched 200. In an embodiment, the semiconductor substrate 100 can be any semiconductor material, for example, Si, SiGe or other semiconductor combination and embodiments of the present invention does not intend to limit thereto. The oxide cushion layer 500 can be silicon oxide, which is used to protect the substrate in a later dry etching. The present disclosure does not intend to limit material of the layer to be etched 200, which can be semiconductor, metal or other need-etch material layers. In the embodiment, metal Mo or W is preferable. Preferably, the mask material 400 can be a photoresist layer or other mask materials, for example, a silicon nitride mask with a thickness of 100 nm-100 μm. The present disclosure does not intend to limit the thickness of the mask material 400, which depends on the layer to be etched 200. In an embodiment of the present disclosure, the mask material 400 is preferably a photoresist layer having a thickness of 4 μm. The mask material 400 can be made by a traditional method, for example, the method may comprise steps as follows: spin-coating a photoresist layer on the metal layer 200, then exposing, developing and removing to form the shape of the mask material 400. Other methods may be also employed to manufacture the mask material 400.

Then a dry etching process is performed on the mask material 400 and the metal layer 200. As shown in FIG. 6, specifically, the mask material 400 is etched in a lateral direction which is parallel to the surface of the substrate 100 while the metal layer 200 is etched in a longitudinal direction which is vertical to the surface of the substrate 100 to obtain an inclined slope angle of the metal layer. The etching gas may comprise $SF_6/CF_4/O_2$. In an embodiment, the metal layer 200 is etched by the $SF_6$ gas and the $CF_4$ gas with a longitudinal etching speed ERA, the mask material is etched by the $O_2$ gas with a lateral etching speed ERB, therefore, the value of the inclined slope angle of the metal layer is determined by the two speeds.

If the layer to be etched 200 is not a metal layer, other etching gases may be introduced, for example, mask material can be etched by $O_2$ or other gases and the layer to be etched can be etched by other gases which are appropriate for etching it. For example, the layer to be etched which is made of semiconductor silicon can be etched by a gas which is appropriate for etching silicon, such as, $SF_6$, $NF_3$, $Cl_2$ or HBr.

According to an embodiment of the present disclosure, the metal layer is a Mo layer on which a PVD process for depositing AlN may be performed later, because an inclination angle of 20 degrees is conducive to AlN deposition, the etch selectivity ratio of the mask material 400 to the metal layer 200 may be preferably larger than 5:1, and the best is 7:1. According to an embodiment of the present disclosure, the etching parameters may comprise: an air pressure of 50-80 mT, an RF Bias of 100-800 W, an Up and down electrode RF power of 20-500 W. The dry etching is performed with the $SF_6$ gas having a flow rate of 10-200 sccm, the $CF_4$ gas having a flow rate of 5-100 sccm and the $O_2$ gas having a flow rate of 20-500 sccm. In the etching process, an optimum etch angle θ can be obtained by adjusting various etching parameters and gas flux parameters. The angle θ is 12 degrees with reference to FIG. 7.

According to a further embodiment of the present disclosure, the metal layer is a W layer, the etch selectivity ratio is preferably larger than 5:1, and the best is 10:1. According an embodiment of the present disclosure, the etching parameters may comprise: an air pressure of 3-60 mT, an RF Bias of 100-500 W, an Up and down electrode RF power of 30-200 W. The dry etching is performed with the $SF_6$ gas having a flow rate of 20-100 sccm, the $CF_4$ gas having a flow rate of 5-100 sccm and the $O_2$ gas having a flow rate of 20-200 sccm. The $SF_6$ gas and the $CF_4$ gas are induced in a direction that is vertical to the surface of the semiconductor substrate 100, while the O2 gas is induced in a direction that is parallel to the surface of the semiconductor substrate 100. In the etching process, an optimum etch angle θ may be obtained by adjusting various etching parameters and gas flux parameters. The angle θ is 60 degrees with reference to FIG. 7.

The $SF_6$ gas and the $CF_4$ gas are major gases used to etch the Mo layer or the W layer while the $O_2$ gas is a major gas used to etch the mask material of photoresist. A higher ratio of the lateral etching speed ERB to the longitudinal etching speed ERA can be obtained through increasing the gas flow ratio of $O_2/(SF_6+CF_4)$, raising reaction g pressure, increasing the upper electrode power and reducing lower electrode power, as a result, a smaller inclination angle θ can be achieved.

As for other etch-needing material A and corresponding mask material B, the above method can be also referred to. Specifically, an appropriate gas A used to etch material A in combination with an appropriate gas B used to etch mask material B can be employed in the method provided in the present disclosure through adjusting gas flow ratio, power, air pressure, etc., to regulate the lateral etch speed ERB to the mask material B and the longitudinal etch speed ERA to the material A according to c tan θ=ERB/ERA.

According to the requirement of a specific design, a desired angle θ can be flexibly modulated. The specific method may comprise, adjusting the ratio of the lateral etching speed to the mask material B to the longitudinal etching speed to the need-etch material A to regulate the slope angle θ. Because c tan θ=ERB/ERA, if ERB:ERA=1:1, an inclination angel θ of 45 degrees can be obtained; in the above embodiment, for example, the slope angle of the Mo layer is 12 degrees, for c tan 12°~5, the etching speed ratio is 5:1. The etching speed ratio can be regulated according to the actual etch situation, for example, if a smaller angle is desired, the ratio may be according larger than 5:1.

In addition, it is noted that, a photoresist layer has a thickness of 100 nanometers to several tens of microns at present, but the specific thickness range concerns inclination angle of the etch slope and the thickness of the layer to be etched. The more inclined the angle is, namely, the larger θ is, the thicker the layer to be etched is, then the thicker the needed photoresist layer is, because more photoresist may be needed to consumed in the etching process. As for the embodiment of the present disclosure, for example, the Mo layer has a thickness of 2000 angstroms, the inclination angle is 12 degrees, (according to the method mentioned above, the lateral etching speed to the mask material is 5 times that the longitudinal etching speed to Mo, and the longitudinal speed of the dry etching to the mask is more than 1.5 times that the lateral speed to the mask), such that a photoresist layer with a thickness larger than 1.5 microns is required to satisfy the process requirement.

According to the method provided by the present disclosure, using the ratio of the lateral speed to the mask material to the longitudinal speed to the layer to be etched, the angle of the etch slope can be flexibly regulated in a large range (theoretically, 0 to 90 degrees can be regulated), such that an inclined etch to the layer to be etched can be obtained. The embodiments of the present disclosure can be applied in various materials etch including but not limit to: metal, metal electrode, semiconductor material and other materials.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. An etching method, comprising:
    forming a layer to be etched on a semiconductor substrate layer;
    forming a mask material on the layer to be etched;
    dry etching the mask material and the layer to be etched;
    in the dry etching process, adjusting the ratio of a lateral etching rate (ERB) to the mask material to a longitudinal etching rate (ERA) to the layer to be etched, according to c tan θ=ERB/ERA, wherein,
    θ is the desired angle value of the inclination angle of the end face of the layer to be etched, the inclination angle is the angle between the end face of the layer to be etched after the dry etching and the surface of the semiconductor substrate layer.

2. A method of claim 1, wherein, the mask material is a photoresist layer having a thickness of 100 nm-100 μm, or other mask material which is well known in field of semiconductor.

3. A method of claim 1, wherein, the layer to be etched is a semiconductor layer.

4. A method of claim 3, wherein, the layer to be etched is a metal layer.

5. A method of claim 4, in the dry etching, the etching gas comprises $SF_6/CF_4/O_2$.

6. A method of claim 5, wherein, the $SF_6$ gas and the $CF_4$ gas are used to etch the metal layer, and the $O_2$ gas is used to etch the mask material.

7. A method of claim 6, wherein, the metal layer is a molybdenum (Mo) layer, the ratio is 7:1.

8. A method of claim 7, wherein, the dry etching is performed with an air pressure of 50-80 mT, an RF Bias of 100-800 W and an Up and down electrode RF power of 20-500 W.

9. A method of claim 7, wherein, the dry etching is performed with the $SF_6$ gas having a flow rate of 10-200 sccm, the $CF_4$ gas having a flow rate of 5-100 sccm and the $O_2$ gas having a flow rate of 20-500 sccm.

10. A method of claim 8, wherein, the dry etching is performed with the $SF_6$ gas having a flow rate of 10-200 sccm, the $CF_4$ gas having a flow rate of 5-100 sccm and the $O_2$ gas having a flow rate of 20-500 sccm.

11. A method of claim 6, wherein, the metal layer is a tungsten (W) layer, the ratio is 10:1.

12. A method of claim 11, wherein, the dry etching is performed with an air pressure of 3-60 mT, an RF Bias of 100-500 W and an Up and down electrode RF power of 30-200 W.

13. A method of claim 11, wherein, the dry etching is performed with the $SF_6$ gas having a flow rate of 20-100 sccm, the $CF_4$ gas having a flow rate of 5-100 sccm and the $O_2$ gas having a flow rate of 20-200 sccm.

14. A method of claim 12, wherein, the dry etching is performed with the $SF_6$ gas having a flow rate of 20-100 sccm, the $CF_4$ gas having a flow rate of 5-100 sccm and the $O_2$ gas having a flow rate of 20-200 sccm.

15. A method of claim 1, wherein, θ is smaller than 20 degrees.

* * * * *